United States Patent [19]
Acocella et al.

[11] Patent Number: 5,899,713
[45] Date of Patent: May 4, 1999

[54] METHOD OF MAKING NVRAM CELL WITH PLANAR CONTROL GATE

[75] Inventors: Joyce E. Molinelli Acocella, Hopewell Junction, N.Y.; Randy W. Mann, Jericho, Vt.

[73] Assignee: International Business Machines Corporation, Armonk, N.Y.

[21] Appl. No.: 08/959,156

[22] Filed: Oct. 28, 1997

[51] Int. Cl.$^6$ .............................................. H01L 21/8247
[52] U.S. Cl. .......................................... 438/201; 438/258
[58] Field of Search .................................... 438/200, 201, 438/210, 258, 626, 631

[56] References Cited

U.S. PATENT DOCUMENTS

| | | | |
|---|---|---|---|
| 4,458,407 | 7/1984 | Hoeg, Jr. et al. | 438/261 |
| 4,516,313 | 5/1985 | Turi et al. | 438/210 |
| 5,120,670 | 6/1992 | Bergmont | 438/261 |
| 5,208,179 | 5/1993 | Okazawa | 438/424 |
| 5,238,855 | 8/1993 | Gill | 438/261 |
| 5,304,503 | 4/1994 | Yoon et al. | 438/258 |
| 5,411,904 | 5/1995 | Yamanchi et al. | 438/264 |
| 5,420,060 | 5/1995 | Gill et al. | 438/264 |
| 5,464,999 | 11/1995 | Bergemont | 257/316 |
| 5,496,756 | 3/1996 | Sharma et al. | 438/258 |
| 5,512,503 | 4/1996 | Hong | 438/266 |

*Primary Examiner*—Chandra Chaudhari
*Attorney, Agent, or Firm*—Scully, Scott, Murphy & Presser; Eugene I. Shkurko

[57] ABSTRACT

A nonvolatile memory cell utilizing planar control gates, which provides advantages of being compatible with self-aligned silicide processes and providing a planar surface for subsequent wiring processes. A substrate defines a first NVRAM region having large floating gate areas with smaller areas cutout to isolate individual memory cells, and a second CMOS Logic region. ONO is deposited on the floating gate areas, and a thick poly layer is deposited in a blanket manner over the first and second regions of the substrate. Resist shapes are patterned over the logic areas in the array where necessary according to a predetermined density algorithm. The poly layer is reactive ion etched, followed by a chemical mechanical polishing (CMP) operation. The final poly gate thickness is 200–220 nm in the CMOS logic areas and in the NVRAM control gate areas between floating gate regions, but only 100–120 nm for the NVRAM control gates over the floating gates. The control gate physical thickness is decoupled (isolated) from the standard logic by standard photoetching processes, and the final structure appears identical from a topological perspective to a standard CMOS structure.

8 Claims, 2 Drawing Sheets

METHOD OF MAKING NVRAM CELL WITH PLANAR CONTROL GATE

BACKGROUND OF THE INVENTION

1. Technical Field

The present invention relates generally to an NVRAM (nonvolatile random access memory) cell with a planar control gate, and more particularly pertains to an NVRAM cell with a planar control gate which is compatible with self-aligned silicide processes and also provides a planar surface for subsequent wiring processes.

2. Discussion of the Prior Art

Salicided (self-aligned silicided) processes do not work well, or work at all, when the polysilicon being silicided has a topography which includes large steps therein. Salicided processes do not work with conventional NVRAM cells because of the severe topography created when the wordline poly passes over the floating gates. In the case of NVRAM technology, the steps are large enough and steep enough to allow spacer formation on the top of the wordlines as they pass over the floating gate polysilicon. The spacer formation guarantees that silicide will not form continuously on the top of the wordline.

SUMMARY OF THE INVENTION

Accordingly, it is a primary object of the present invention to provide an NVRAM cell with a planar control gate. The advantage of this type of structure is: 1) it is compatible with self-aligned silicide (salicide) processes; and 2) it provides a planar surface for subsequent wiring processes similar to a standard CMOS process without embedded NVRAM. The technique for achieving this structure relies upon the CMP (chemical mechanical polishing) process. Large floating gate areas are defined with smaller areas cutout to isolate the individual memory cells. ONO is deposited on the floating gate areas, and a second poly layer is deposited thereon, or the ONO can be deposited first as described here and then the floating gate patterned. The planar process of the present invention departs from a standard CMOS process at this point. The second poly deposition is thicker for the planar process of the subject invention when compared to a standard CMOS process at this point, 320 nm vs 220 nm respectively. This thicker poly deposition is required to allow for poly removal during a subsequent planarization process. Resist shapes are patterned over the logic areas in the array where necessary according to a predetermined density algorithm. The second poly is reactive ion etched, followed by a chemical mechanical polishing (CMP) step to complete the planarization process. The final poly gate thickness is 200–220 nm in the logic areas and in the NVRAM control gate areas between floating gate regions, but only 100–120 nm for the control gate over the floating gate regions. The control gate physical thickness is decoupled (isolated) from the standard logic by standard photo-patterning and RIE etching processes, and the final structure of the CMOS logic device looks identical from a topological perspective to a standard CMOS structure. The control gate of the NVRAM and the FET gate of the CMOS device are defined during this etch step. An alternative process variation may involve a nitride mask incorporated in the logic areas to prevent dishing during the CMP step if this is a concern.

In accordance with the teachings herein, the present invention provides a method of fabricating mixed first and second type devices on a common substrate having a first type device region thereon and a second type device region thereon, wherein the first type device region is thicker than the second type device region. A continuous conductive layer is formed over both the first type device region and the second type device region, to form first device gates, and second device gates. The conductive layer is then planarized such that the conductive layer forming the first device gates is planar with the conductive layer forming the second device gates, and the conductive layer forming the second device gates is thicker than the conductive layer forming the first device gates.

In greater detail, the substrate has a first NVRAM region thereon and a second CMOS region thereon, and a layer of polysilicon is deposited for formation of the NVRAM control gates and the CMOS gates. Following a planarizing operation, the upper surface of the resulting CMOS gates surfaces is planar with the upper surface of the NVRAM control gates, and the conductive layer forming the CMOS gates is thicker than the conductive layer forming the NVRAM gates over floating gate regions. The planarizing step preferably comprises reactive ion etching of the conductive layer through a mask, followed by chemical mechanical polishing of the conductive layer. Following the planarizing operation and patterning to form discrete control gates, a metal layer is deposited and a silicide is formed. Alternatively, following the planarizing step, a metal layer is deposited, a silicide is formed on the planarized surface, followed by patterning to form discrete control gates.

The present invention also provides a semiconductor device comprising a planar substrate having thereon a first multilayer device having an upper conductive layer and a second multilayer device having an upper conductive layer. The second multilayer device has a different number of layers than the first multilayer device, and the upper conductive layers of the first and second multilayer devices have planarized coplanar top conductive surfaces.

In greater detail, the first multilayer device comprises a control gate over a floating gate for an NVRAM memory cell, and the second multilayer device comprises a gate of an FET, and the upper conductive layer of the first multilayer device is thinner than the upper conductive layer of the second multilayer device. The first multilayer device includes a layer of polysilicon for NVRAM control gates, and the second multilayer device includes a layer of polysilicon for CMOS FET gates. Following a planarizing operation, the upper surface of the resulting CMOS gates is planar with the upper surface of the NVRAM control gates, and the upper conductive layer of the CMOS gates is thicker than the upper conductive layer of the NVRAM gates over floating gate regions.

BRIEF DESCRIPTION OF THE DRAWINGS

The foregoing objects and advantages of the present invention for an NVRAM cell with a planar control gate may be more readily understood by one skilled in the art with reference being had to the following detailed description of several preferred embodiments thereof, taken in conjunction with the accompanying drawings wherein like elements are designated by identical reference numerals throughout the several views, and in which.

DETAILED DESCRIPTION OF THE DRAWINGS

Figure 1:
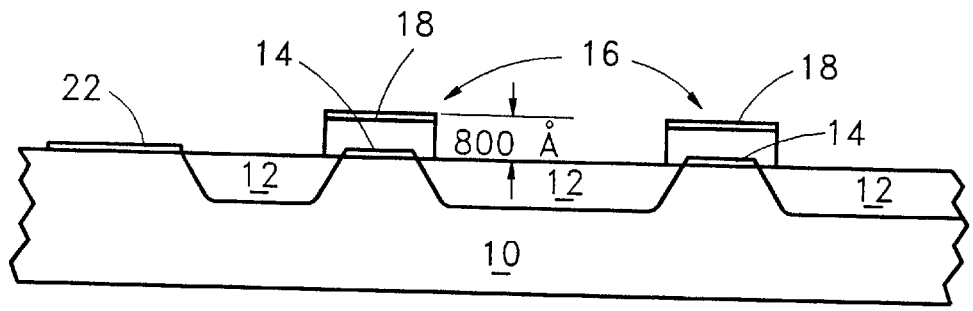
FIG. 1 illustrates a portion of a semiconductor chip, which is primarily a CMOS (complementary-metal-oxide semiconductor) chip having areas of NVRAM (nonvolatile random access memory) formed therein.

Referring to the drawings in detail, FIG. 1 illustrates a portion of a semiconductor chip, which contains both CMOS (complementary-metal-oxide semiconductor) areas and NVRAM (nonvolatile random access memory) areas formed or embedded therein. The semiconductor chip is formed on a substrate 10 having a plurality of STI (shallow trench isolation) oxide isolation regions 12 formed therein, and a layer of tunnel oxide 14 and CMOS gate oxide 22 formed on the silicon surface.

The NVRAM area of the chip includes a plurality of floating gates 16 formed from a first layer of polysilicon deposited thereon, each of which has a height of approximately 1000 Å. This height can vary depending on the specific integration needs, 1000±500 Å is a reasonable range. Each floating gate has a layer of ONO (oxide-nitride-oxide) 18 deposited on the top of the first layer of poly, and oxide regions grown on the sides thereof (not shown).

The CMOS area of the chip includes a plurality of CMOS oxide gates 22 formed thereon, only one of which is illustrated with an exaggerated height in FIG. 1.

Figure 2:
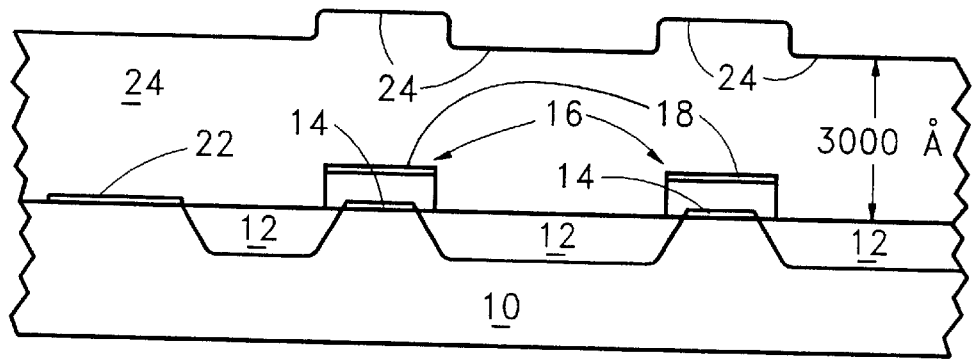
FIG. 2 illustrates the structure of FIG. 1 having a second polysilicon layer deposited thereon to eventually form control gates and logic devices on the semiconductor chip.

FIG. 2 illustrates the structure of FIG. 1 having a second polysilicon layer 24 deposited thereon in a blanket manner over the memory cells, the isolation regions and the CMOS regions. The second poly layer eventually forms control gates and CMOS logic device gates on the semiconductor chip.

The second polysilicon layer 24 is slightly thicker (500–1000 Å thickness) for optimization of the planarization process as described herein when compared to a more standard prevalent prior art thickness, 320 nm vs 220 nm respectively. The thicker layer of poly is required to allow for poly removal during a subsequent planarization process. The second poly layer 24 is deposited conformally over the structure of FIG. 1, as illustrated in FIG. 2, such that the upper surface thereof conforms generally to the structure on the chip on which the polysilicon layer is deposited.

Figure 3:
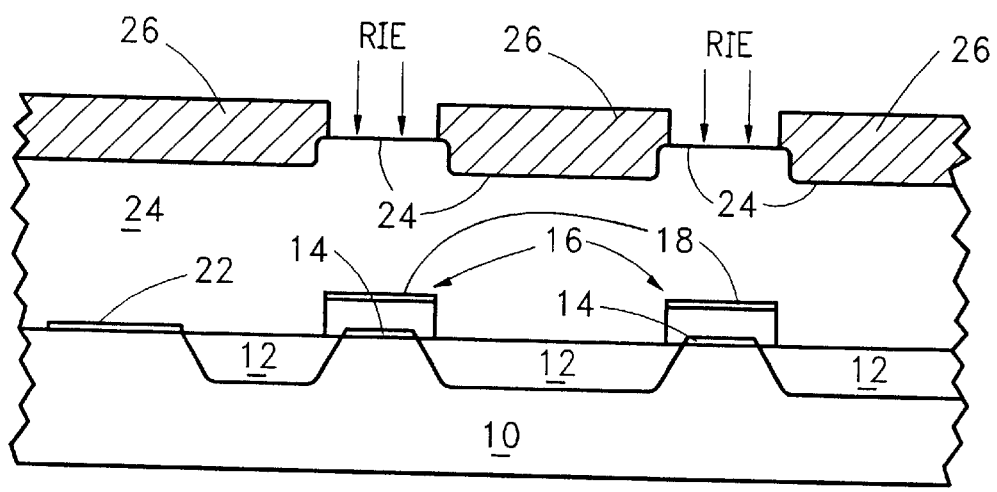
FIG. 3 illustrates the structure of FIG. 2 having resist shapes patterned over the logic areas and in the array where necessary to form a mask to enable the poly to be directionally reactive ion etched through the openings in the resist mask to remove the major topographical humps in the top of the poly.

FIG. 3 illustrates the structure of FIG. 2 having resist shapes 26 patterned over the logic areas and in the array where necessary according to the predetermined density algorithm. The resist shapes form a mask to enable the poly to be directionally RIE'd (reactive ion etched) through the openings in the resist mask to remove the major topographical humps in the top of the poly, as shown in FIG. 3.

Figure 4:
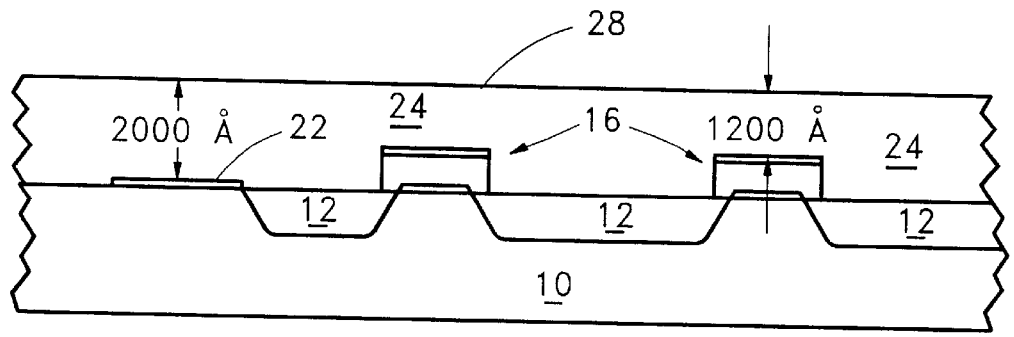
FIG. 4 illustrates the different thicknesses of the poly remaining over the NVRAM floating gates, which form the control gates therefor, and the poly remaining over the CMOS gates, after a chemical mechanical polishing operation which provides a planar upper surface for the poly.

The RIE operation is followed by a CMP (chemical mechanical polishing) operation to smooth the top of the poly, to achieve the structure shown in FIG. 4.

The final poly gate thickness is 200–220 nm (2000 Å) in the CMOS logic areas and in the NVRAM control gate areas between floating gate regions, but only 100–120 nm (1200 Å) for the control gates over the floating gates. The control gate physical thickness is then decoupled or isolated from the standard logic by standard photo-patterning, RIE etching and silicide formation processes, and the final structure looks identical from a topological perspective to a standard CMOS structure. It is noted that a nitride mask can be incorporated in the logic area to prevent dishing during the CMP step if this is a concern.

FIG. 4 illustrates the different thicknesses of the poly remaining over the NVRAM floating gates, which form the control gates, and the poly remaining over the CMOS gates and between NVRAM floating gates, after the CMP operation which provides a planar upper surface for the poly.

Figure 5:
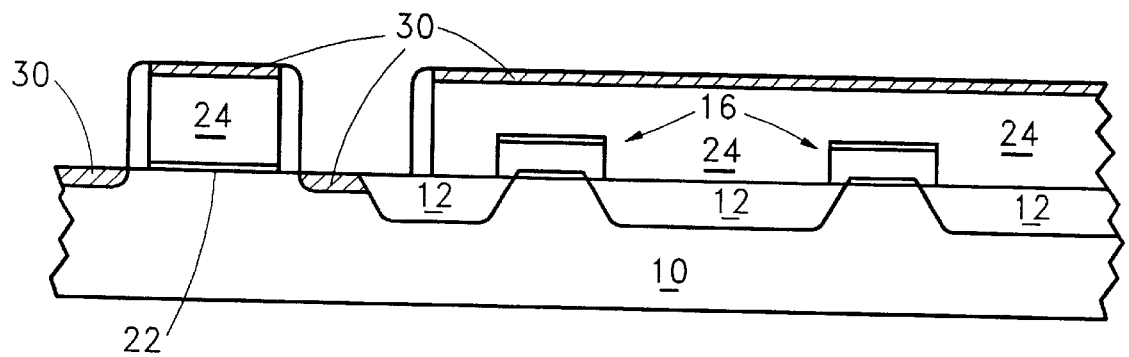
FIGS. 5 and 6 illustrate the structure of FIG. 4 after the poly and salicided metal layer are patterned with normal processing, with FIG. 5 being in the same direction as FIG. 4 and FIG. 6 being rotated 90° with respect to FIGS. 4 and 5.

After achieving the planar upper surface, the gates are patterned and etched, decoupling the CMOS regions from the NVRAM regions. This step also completes the definition of the control gate poly over the floating gate regions, as shown in FIG. 5. The side wall spacers are then formed by blanket deposition and RIE, followed by the necessary implants and anneal steps. A blanket metal layer 28 consisting of Ti or Co is deposited thereon, for a salicide operation thereon to produce low resistance wordlines and gates on the chip. Silicide is also formed on source and drain regions during this step. An option is to deposit a metal or form silicide on top of the gates before the gate patterning RIE, followed by formation of silicide on the source/drain regions after the gate patterning RIE, as is known in the industry.

FIG. 5 illustrates the structure of FIG. 4 after the poly and salicided metal layer 30 are patterned with normal processing techniques to produce the control gates over the floating gates and between floating gates in the NVRAM portions of the chip and the control gates in the CMOS (FET) portions of the chip.

Figure 6:
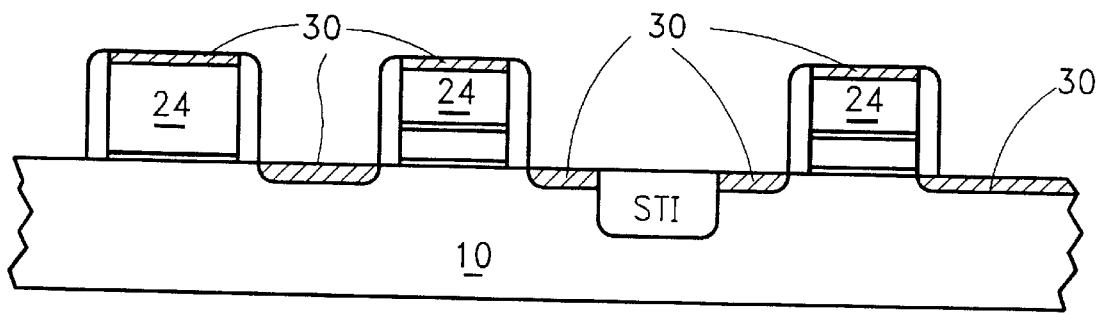

FIG. 6 illustrates the structure of FIG. 5 rotated 90° with respect to the view of FIG. 5.

While several embodiments and variations of the present invention for an NVRAM cell with a planar control gate are described in detail herein, it should be apparent that the disclosure and teachings of the present invention will suggest many alternative designs to those skilled in the art.

Having thus described our invention, what we claim as new, and desire to secure by Letters Patent is:

1. A method of fabricating mixed first and second type devices on a common substrate, which comprises:

a. providing a substrate having a first type device region thereon and a second type device region thereon, wherein the first type device region is thicker than the second type device region;

b. forming a continuous conductive layer over both the first type device region and the second type device region, wherein the conductive layer over the first type device region is to form first device gates, and the conductive layer over the second type device region is to form second device gates; and c. planarizing the conductive layer such that the conductive layer forming the first device gates is planar with the conductive layer forming the second device gates, and the conductive layer forming the second device gates is thicker than the conductive layer forming the first device gates.

2. A method as claimed in claim 1, wherein said step of providing comprises providing a substrate having a first NVRAM region thereon and a second CMOS region thereon, the step of forming comprises depositing a layer of polysilicon for the NVRAM control gates and the CMOS gates, and wherein following the planarizing step the upper surface of the resulting CMOS gates is planar with the upper surface of the NVRAM control gates, and the conductive layer forming the CMOS gates is thicker than the conductive layer forming the NVRAM gates over floating gate regions.

3. A method as claimed in claim 2, wherein the planarizing step comprises reactive ion etching of the conductive layer through a mask, followed by chemical mechanical polishing of the conductive layer.

4. A method as claimed in claim 3, wherein following the planarizing step, a metal layer is deposited, a silicide is formed on the planarized surface, followed by patterning to form discrete control gates.

5. A method as claimed in claim 3, wherein following the planarizing step and patterning to form discrete control gates, a metal layer is deposited and a silicide is formed.

6. A method as claimed in claim 1, wherein the planarizing step comprises reactive ion etching of the conductive layer through a mask, followed by chemical mechanical polishing of the conductive layer.

7. A method as claimed in claim 1, wherein following the planarizing step, a metal layer is deposited, a silicide is formed on the planarized surface, followed by patterning to form discrete control gates.

8. A method as claimed in claim 1, wherein following the planarizing step and patterning to form discrete control gates, a metal layer is deposited and a silicide is formed.

* * * * *